US008148648B2

(12) United States Patent
Nelson et al.

(10) Patent No.: US 8,148,648 B2
(45) Date of Patent: Apr. 3, 2012

(54) COMBINATION EXTRUDED AND CAST METAL OUTDOOR ELECTRONICS ENCLOSURE

(75) Inventors: Michael J. Nelson, Prior Lake, MN (US); Michael J. Wayman, Waconia, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 473 days.

(21) Appl. No.: 12/410,736

(22) Filed: Mar. 25, 2009

(65) Prior Publication Data

US 2009/0308655 A1 Dec. 17, 2009

Related U.S. Application Data

(60) Provisional application No. 61/060,547, filed on Jun. 11, 2008.

(51) Int. Cl.
*H02B 1/015* (2006.01)
*H05K 5/00* (2006.01)
*H01L 23/06* (2006.01)
(52) U.S. Cl. ......... 174/500; 174/520; 174/565; 361/724
(58) Field of Classification Search ............ 174/48, 174/49, 66, 67, 68.1, 68.3, 500, 520, 565; 312/223.1; 361/752
See application file for complete search history.

(56) References Cited

U.S. PATENT DOCUMENTS

| 1,683,793 | A |   | 9/1928  | Nyman |
|-----------|---|---|---------|-------|
| 2,226,615 | A |   | 12/1940 | Killen |
| 2,259,185 | A |   | 10/1941 | Swedman |
| 2,704,688 | A |   | 3/1955  | Adell |
| 2,723,896 | A |   | 11/1955 | Wurtz |
| 2,740,658 | A |   | 4/1956  | Kesich |
| 3,014,158 | A |   | 12/1961 | Nelson |
| 3,126,589 | A |   | 3/1964  | Monti |
| 3,138,833 | A |   | 6/1964  | Neuman |
| 3,355,540 | A | * | 11/1967 | Newell ................. 174/16.3 |
| 3,371,447 | A |   | 3/1968  | Ruff |
| 3,501,866 | A |   | 3/1970  | Johnson |
| 3,751,131 | A | * | 8/1973  | Denker et al. ............ 312/242 |
| 3,837,120 | A |   | 9/1974  | Hanks |
| 3,894,767 | A |   | 7/1975  | Schatzler |
| 3,987,655 | A |   | 10/1976 | Myotte |

(Continued)

FOREIGN PATENT DOCUMENTS

JP        10180345 A  *  7/1998

OTHER PUBLICATIONS

Machine Translation JP10180345 (1998).*

*Primary Examiner* — Quyen Leung
*Assistant Examiner* — Jose Gonzalez Quinones
(74) *Attorney, Agent, or Firm* — Fogg & Powers LLC

(57) ABSTRACT

A method for forming an electronics enclosure is disclosed. The method comprises extruding a backplane having a first extruded length, the backplane comprising slots on opposing sides of the backplane, wherein the slots extend along the first extruded length. The method further comprises extruding at least one door panel at the first extruded length, wherein the backplane and the door panel each have extruded hinge features for pivotally coupling the door panel to the backplane, and coupling at least two cast metal plates to opposing ends of the backplane, where each of the cast metal plates comprise a gland that aligns with the slots of the backplane to create a continuous channel for inserting a seal.

20 Claims, 5 Drawing Sheets

U.S. PATENT DOCUMENTS

| | | | |
|---|---|---|---|
| 4,114,065 A | 9/1978 | Horvay | |
| 4,166,195 A | 8/1979 | Schwab | |
| 4,308,742 A | 1/1982 | Harrison et al. | |
| 4,371,757 A | 2/1983 | Debortoli et al. | |
| 4,549,602 A | 10/1985 | Espinoza | |
| 4,742,864 A | 5/1988 | Duell et al. | |
| 4,820,885 A | 4/1989 | Lindsay | |
| 4,861,077 A | 8/1989 | Welkey | |
| 4,862,324 A | 8/1989 | Kalvaitis | |
| 4,994,315 A | 2/1991 | Schreiber | |
| 5,134,250 A | 7/1992 | Caveney et al. | |
| 5,267,762 A | 12/1993 | Gromotka | |
| 5,274,731 A | 12/1993 | White | |
| 5,309,680 A | 5/1994 | Kiel | |
| 5,383,722 A | 1/1995 | Chen | |
| 5,445,787 A | 8/1995 | Friedman et al. | |
| 5,465,528 A | 11/1995 | Schinzel | |
| 5,490,408 A | 2/1996 | Ando et al. | |
| 5,548,085 A | 8/1996 | Flores | |
| 5,710,804 A | 1/1998 | Bhame et al. | |
| 5,713,647 A | 2/1998 | Kim | |
| 5,806,948 A | 9/1998 | Rowan, Sr. et al. | |
| 5,820,954 A * | 10/1998 | Ooyagi et al. | 428/35.7 |
| 5,894,407 A | 4/1999 | Aakula et al. | |
| 5,946,193 A | 8/1999 | Hendrix et al. | |
| 6,065,612 A | 5/2000 | Rinderer | |
| 6,082,441 A | 7/2000 | Boehmer et al. | |
| 6,107,575 A | 8/2000 | Miranda | |
| 6,116,615 A | 9/2000 | Trehan | |
| 6,142,595 A | 11/2000 | Dellapi et al. | |
| 6,158,832 A | 12/2000 | Costa | |
| 6,238,027 B1 | 5/2001 | Kohler et al. | |
| 6,253,834 B1 | 7/2001 | Sterner | |
| 6,280,232 B1 | 8/2001 | Beecher et al. | |
| 6,299,008 B1 | 10/2001 | Payne | |
| 6,310,772 B1 | 10/2001 | Hutchinson et al. | |
| 6,333,461 B1 * | 12/2001 | Marcou et al. | 174/68.3 |
| 6,340,317 B1 | 1/2002 | Lin | |
| 6,350,000 B1 | 2/2002 | Van Benthem | |
| 6,384,323 B2 | 5/2002 | Elm | |
| 6,437,244 B1 | 8/2002 | Vander Velde | |
| 6,465,561 B1 | 10/2002 | Yarbrough et al. | |
| 6,469,911 B1 | 10/2002 | Brown et al. | |
| 6,564,428 B2 | 5/2003 | Richard | |
| 6,579,029 B1 | 6/2003 | Sevde et al. | |
| 6,788,535 B2 | 9/2004 | Dodgen et al. | |
| 6,835,891 B1 | 12/2004 | Herzog et al. | |
| 6,968,647 B2 | 11/2005 | Levesque et al. | |
| 6,972,367 B2 | 12/2005 | Federspiel et al. | |
| 6,995,978 B2 | 2/2006 | Strauss | |
| 7,027,300 B2 | 4/2006 | Lord | |
| 7,032,277 B2 | 4/2006 | Rolla et al. | |
| 7,068,516 B2 | 6/2006 | Chan | |
| 7,225,586 B2 | 6/2007 | Levesque et al. | |
| 7,245,485 B1 | 7/2007 | Morrell | |
| 7,355,848 B1 | 4/2008 | Hodge et al. | |
| 7,450,382 B1 | 11/2008 | Fischer et al. | |
| 7,457,123 B1 | 11/2008 | Wayman | |
| 2002/0125799 A1 | 9/2002 | Landsberger | |
| 2002/0130598 A1 | 9/2002 | Schmidt | |
| 2003/0099101 A1 | 5/2003 | Skrepcinski | |
| 2003/0102141 A1 | 6/2003 | Schneider | |
| 2004/0112623 A1 | 6/2004 | L'Henaff et al. | |
| 2004/0114326 A1 | 6/2004 | Dodgen | |
| 2004/0121132 A1 | 6/2004 | Slyne | |
| 2004/0222517 A1 * | 11/2004 | Robertson et al. | 257/718 |
| 2005/0205582 A1 * | 9/2005 | Cheng | 220/573.3 |
| 2006/0279927 A1 | 12/2006 | Strohm | |
| 2007/0086164 A1 * | 4/2007 | Hernandez et al. | 361/703 |
| 2007/0247809 A1 | 10/2007 | McClure | |
| 2008/0031585 A1 * | 2/2008 | Solheid et al. | 385/135 |
| 2008/0235907 A1 | 10/2008 | Wayman et al. | |
| 2008/0237420 A1 | 10/2008 | Wayman et al. | |
| 2008/0238270 A1 | 10/2008 | Wayman et al. | |
| 2008/0239632 A1 | 10/2008 | Wayman | |
| 2008/0239669 A1 | 10/2008 | Wayman | |
| 2008/0239673 A1 | 10/2008 | Wayman | |
| 2008/0239688 A1 | 10/2008 | Casey et al. | |
| 2008/0240164 A1 | 10/2008 | Zavadsky | |
| 2008/0240225 A1 | 10/2008 | Zavadsky et al. | |
| 2008/0241571 A1 | 10/2008 | Wayman et al. | |
| 2008/0242232 A1 | 10/2008 | Zavadsky et al. | |
| 2008/0245938 A1 | 10/2008 | Qualy et al. | |
| 2008/0278912 A1 | 11/2008 | Zavadsky et al. | |
| 2008/0318631 A1 | 12/2008 | Baldwin | |
| 2009/0102140 A1 | 4/2009 | Deaver | |
| 2009/0307983 A1 | 12/2009 | Nelson | |
| 2009/0309467 A1 | 12/2009 | Nelson | |

* cited by examiner

COMBINATION EXTRUDED AND CAST METAL OUTDOOR ELECTRONICS ENCLOSURE

This application claims the benefit of priority under 35 U.S.C. 119 to U.S. Provisional Patent Application Ser. No. 61/060,547, filed on Jun. 11, 2008 and entitled "COMBINATION EXTRUDED AND CAST METAL OUTDOOR ELECTRONICS ENCLOSURE," the disclosure of which is incorporated herein by reference in its entirety.

CROSS REFERENCE TO RELATED APPLICATIONS

This application is related to the following co-pending and commonly assigned U.S. patent applications, filed on Jun. 11, 2008, each of which is incorporated herein by reference in its entirety:

U.S. patent application Ser. No. 12/137,322, entitled "COMMUNICATION MODULES" and which is referred to here as the '322 Application;

U.S. patent application Ser. No. 12/137,297, entitled "APPARATUS FOR MOUNTING A MODULE AND ENABLING HEAT CONDUCTION FROM THE MODULE TO THE MOUNTING SURFACE" and which is referred to here as the '297 Application;

U.S. Provisional Patent Application Ser. No. 61/060,589, entitled "SUSPENSION METHOD FOR COMPLIANT THERMAL CONTACT OF ELECTRONICS MODULES" and which is referred to here as the '589 Application;

U.S. patent application Ser. No. 12/137,307, entitled "ANGLED DOORS WITH CONTINUOUS SEAL" and which is referred to here as the '307 Application;

U.S. Provisional Patent Application Ser. No. 61/060,523, entitled "L-SHAPED DOOR WITH 3-SURFACE SEAL FOR ENDPLATES" and which is referred to here as the '523 Application;

U.S. Provisional Patent Application Ser. No. 61/060,576, entitled "L-SHAPED DOORS WITH TRAPEZOIDAL SEAL" and which is referred to here as the '576 Application;

U.S. patent application Ser. No. 12/137,309, entitled "SYSTEMS AND METHODS FOR VENTURI FAN-ASSISTED COOLING" and which is referred to here as the '309 Application;

U.S. Provisional Patent Application Ser. No. 61/060,584, entitled "SYSTEMS AND METHODS FOR CABLE MANAGEMENT" and which is referred to here as the '584 Application;

U.S. Provisional Patent Application Ser. No. 61/060,581, entitled "CAM SHAPED HINGES" and which is referred to here as the '581 Application;

U.S. patent application Ser. No. 12/137,313, entitled "SOLAR SHIELDS" and which is referred to here as the '313 Application;

U.S. Provisional Patent Application Ser. No. 61/060,501, entitled "APPARATUS AND METHOD FOR BLIND SLOTS FOR SELF DRILLING/SELF-TAPPING SCREWS" and which is referred to here as the '501 Application;

U.S. Provisional Patent Application Ser. No. 61/060,593, entitled "SYSTEMS AND METHODS FOR THERMAL MANAGEMENT" and which is referred to here as the '593 Application;

U.S. Provisional Patent Application Ser. No. 61/060,762, entitled "SERF BOARD COMPONENTS" and which is referred to here as the '762 Application; and U.S. Provisional Patent Application Ser. No. 61/060,740, entitled "PULL-OUT SHELF FOR USE IN A CONFINED SPACE FORMED IN A STRUCTURE" and which is referred to here as the '740 Application.

BACKGROUND

Outdoor telecommunications enclosures that contain high-power electronic components are typically constructed in varying dimensions depending on customer requirements. At the same time, it is often necessary that these electronic components be securely enclosed in the outdoor enclosure to prevent tampering with the electronic components and to protect the electronic components from the outside environment.

A common method of providing multiple enclosure configurations requires a manufacturer to invest in individual sets of assembly tools for each enclosure configuration. This results in additional manufacturing costs in producing the enclosure. Thus, there is a need in the art for improvements in constructing outdoor electronics enclosures.

SUMMARY

The following specification provides for a combination extruded and cast metal outdoor electronics enclosure. This summary is made by way of example and not by way of limitation. It is merely provided to aid the reader in understanding some aspects of at least one embodiment described in the following specification.

Particularly, in one embodiment, a method for forming an electronics enclosure is provided. The method comprises extruding a backplane having a first extruded length, the backplane comprising first slots on opposing sides of the backplane, wherein the first slots extend along the first extruded length. The method further comprises extruding at least one door panel at the first extruded length, wherein the backplane and the door panel each have extruded hinge features for pivotally coupling the door panel to the backplane, and coupling at least two cast metal plates to opposing ends of the backplane, where each of the cast metal plates comprise a second slot that aligns with the first slots of the backplane to create a continuous channel for inserting a seal.

BRIEF DESCRIPTION OF THE DRAWINGS

These and other features, aspects, and advantages are better understood with regard to the following description, appended claims, and accompanying drawings where:

DETAILED DESCRIPTION

Embodiments disclosed herein relate to a combination extruded and cast metal enclosure for housing various electrical equipment. The embodiments disclosed herein illustrate a common extrusion process that provides multiple variations of similar enclosures to meet customer requirements. In one embodiment, a backplane and door panels of the enclosure are formed by an extrusion process. The enclosure is enclosed by installing top and bottom endplates to the backplane, where the top and bottom endplates are manufactured using a casting process.

Depending on the target design volume of the enclosure, the backplane and the door panels are extruded to a certain length. For example, the more volume required to house the equipment, the longer the backplane and the door panels. The same sets of top and bottom endplates are interchangeably attached to any backplane length and tooled for specific applications. In particular, the extruded portions of the enclosure are of a prescribed length based on a desired configuration for the enclosure, with the top and bottom endplates suitable for use for multiple configurations of the enclosure.

Figure 1C:
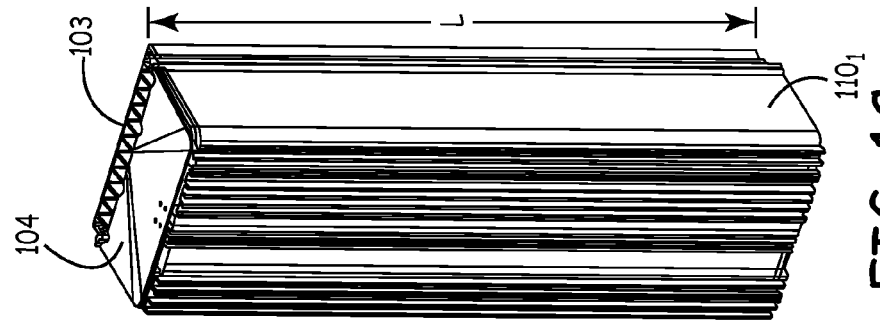
FIGS. 1A, 1B, and 1C are perspective views of an embodiment of a combination extruded and cast metal outdoor electronics enclosure.
Figure 1B:
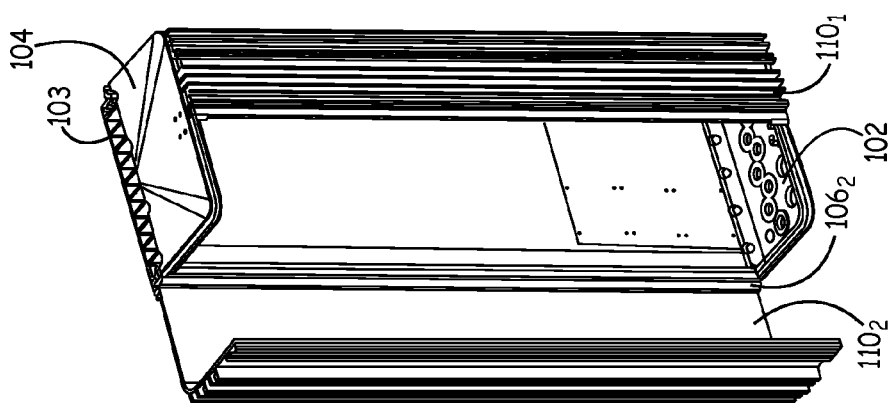
Figure 1A:
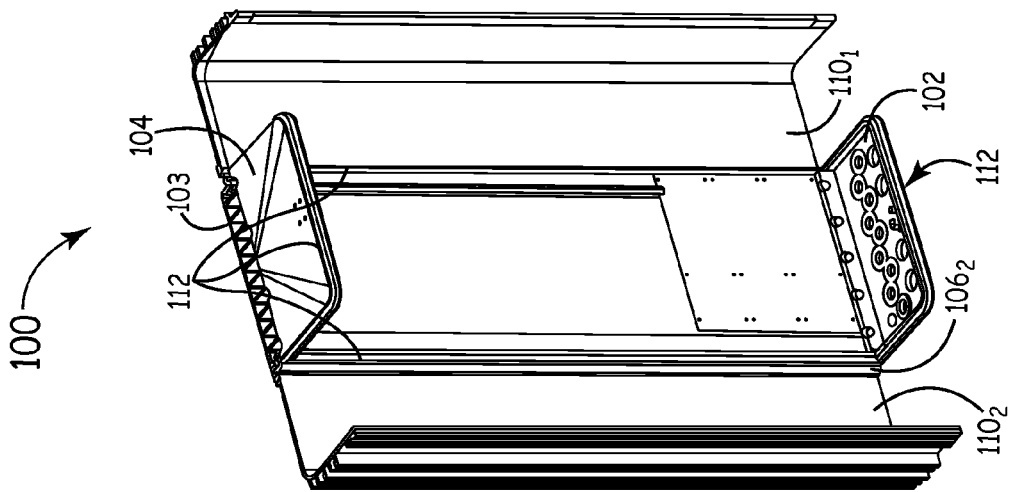

FIGS. 1A to 1C are perspective views of an embodiment of an extruded and cast metal electronics enclosure 100. The enclosure 100 comprises a bottom endplate 102, a backplane 103, a top endplate 104, and at least two door panels $110_1$ and $110_2$. The backplane 103 and the door panels $110_1$ and $110_2$ are each manufactured as extruded members while the bottom endplate 102 and the top endplate 104 are commonly cast and machined members. The backplane 103 and the door panels $110_1$ and $110_2$ can thus be manufactured to any desired length. The door panels $110_1$ and $110_2$ are each coupled to opposing sides of the backplane 103 by a set of hinges $106_1$ and $106_2$. For ease of illustration, the hinge $106_2$ is shown in FIGS. 1A and 1B. In the example embodiment of FIGS. 1A and 1B, the hinges $106_1$ and $106_2$ are integral extruded features of the door panels $110_1$ and $110_2$ and the backplane 103 as further discussed below with respect to FIG. 3.

As shown in FIG. 1C, the backplane 103 and the door panels $110_1$ and $110_2$ are extruded to a single length L. In one implementation, the backplane 103 and the door panels $110_1$ and $110_2$ are cut to one or more desired lengths based on the desired configuration for the enclosure 100. The bottom endplate 102 and the top endplate 104 are then secured to the backplane 103 as shown generally in FIGS. 1A and 1B. The backplane 103, the door panels $110_1$ and $110_2$, the bottom endplate 102, and the top endplate 104 define a housing for electronic components when the door panels $110_1$ and $110_2$ are closed. This housing further creates a sealed environment. In one embodiment, the door panels $110_1$ and $110_2$ and the endplates 102 and 104 each include a perimeter seal 112 for the enclosure 100. In particular, when the door panels $110_1$ and $110_2$ are closed, the door panels $110_1$ and $110_2$ will abut the endplates 102 and 104 to compress the perimeter seal 112 and protect the electronic components within the enclosure 100 from weather or other environmental conditions.

Figure 2:
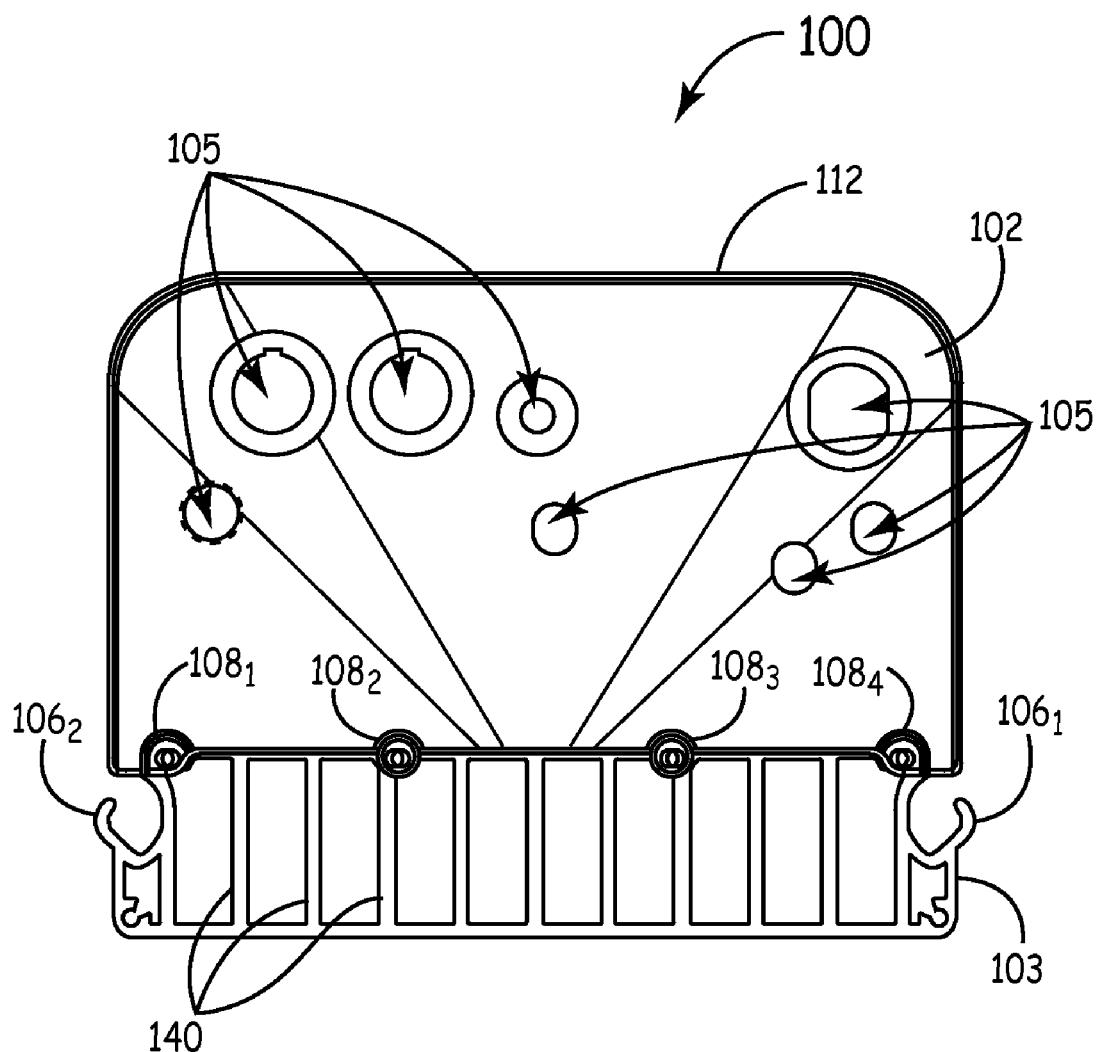
FIG. 2 is a plan view of an embodiment of a cast plate and an extruded panel from a combination extruded and cast metal outdoor electronics enclosure.

FIG. 2 illustrates the bottom endplate 102 of FIG. 1A affixed to the backplane 103. In one embodiment, the endplate 102 is mechanically coupled to the backplane 103 using screw fixtures as discussed in further detail below. In alternate embodiments, the endplate 102 can also be coupled by welding, bonding or pressing. The endplate 102 comprises cable access apertures 105 that function to provide cable penetrations for the enclosure 100. In the example embodiment of FIG. 2, the cable access apertures 105 have various dimensions for allowing various types of telecommunication cabling into the enclosure 100.

FIG. 2 also illustrates various features integrally extruded into the backplane 103 such as parts of hinges $106_1$ and $106_2$ and extruded features $108_1$ to $108_4$ for fastening the endplate 102 to the backplane 103. In one embodiment, extruded features $108_1$ to $108_4$ are suited for accepting self-drilling, self-tapping screw fixtures, similar to the screw fixtures disclosed in the '501 application. For example, the screw fixtures accepted by the extruded features $108_1$ to $108_4$ insert into and form threads into the material of the backplane 103. The extruded features $108_1$ to $108_4$ are appropriately sized as 'pilot-hole' features for accepting a least a portion of the threads of the screw fixtures when starting attachment of the backplane 103 to the endplate 102. In addition, the 'pilot-hole' features of the extruded features $108_1$ to $108_4$ are sized for appropriate screw fixtures to provide a suitable amount of tensile strength to overcome any (potential) stress and strain experienced by the assembled enclosure 100.

Figure 3:
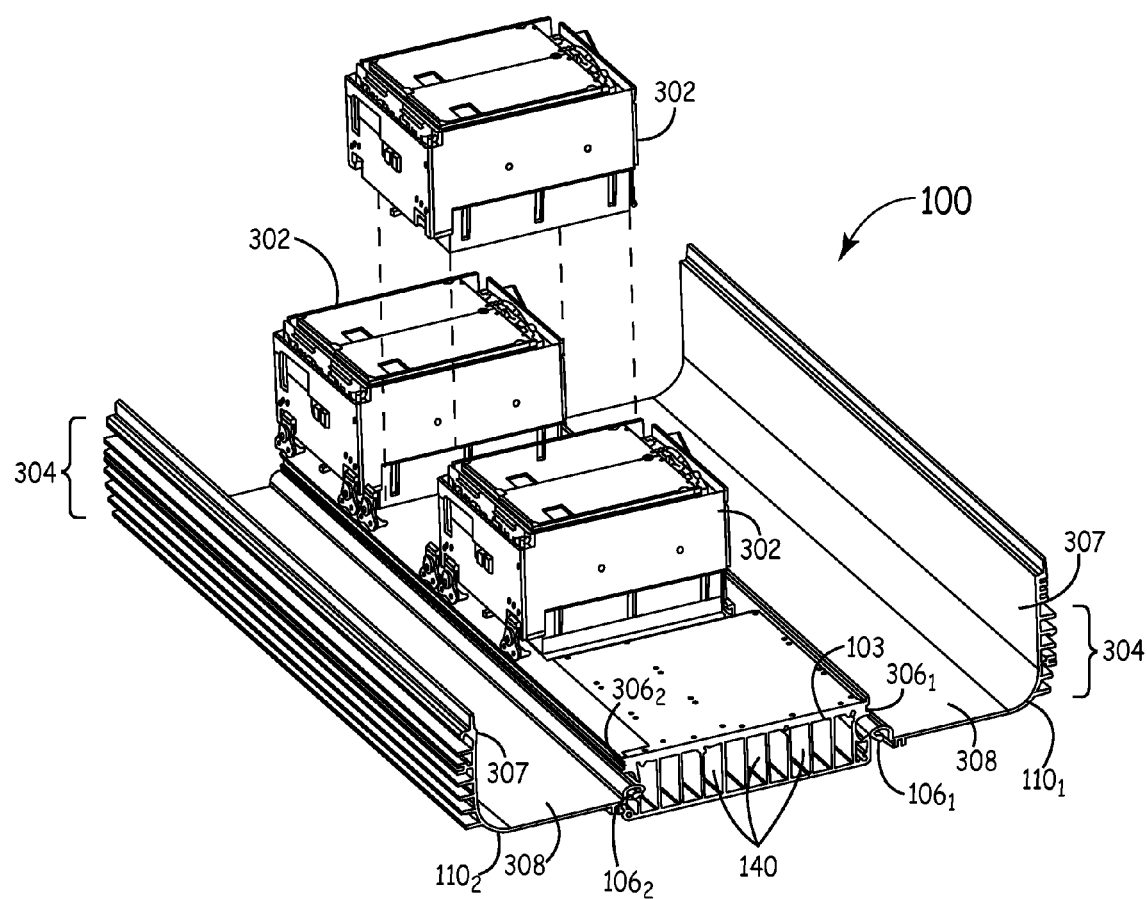
FIG. 3 is an exploded perspective view of an embodiment of an outdoor electronics enclosure formed from the extruded panel of FIG. 2.

FIG. 3 is an exploded perspective view of the enclosure 100 formed from the backplane 103 of FIG. 1A. As shown in FIG. 3, the enclosure 100 comprises the backplane 103 (serving as a structural backplane 103 for the enclosure 100) and at least two door panels $110_1$ and $110_2$ that each pivot around hinges $106_1$ and $106_2$, respectively. The enclosure 100 is shown in FIG. 3 with the door panels 110 in an open position and the endplate 102 removed to reveal one or more electronic components 302 housed within the enclosure 100. With the door panels 110 in an open position, the embodiment shown in FIG. 3 further reveals slots $306_1$ and $306_2$ extending along the extruded length of the backplane 103.

In the particular embodiment shown in FIG. 3, the electronic components 302 include, but are not limited to, the communication modules discussed in the '322 application. The length of the backplane 103 and the door panels 110 are based on a particular configuration and number of the electronic components 302 to be installed in the enclosure 100. In addition, the enclosure 100 shown in FIG. 3 is the enclosure described in the '307 application, wherein the door panels 110 are the described "L-shaped" door panels. For example, each of the door panels 110 comprises a first extruded section 307 and a second extruded section 308 that form an approximately 90 degree angle when assembled as shown in the particular embodiment of FIG. 3. In a closed position, the door panels $110_1$ and $110_2$ interconnect with each other and together abut the exposed perimeter of the endplates 102 and 104 to enclose the electronic components 302.

As shown in FIG. 3, the hinges $106_1$ and $106_2$ are extruded into the door panels $110_1$ and $110_2$ and the backplane 103 as complementing cam-shaped profiles to provide a suitable clearance level for absorbing any twisting and bowing in the extrusion process for the enclosure 100. The cam-shaped profiles provide an acceptable clearance gap in order to attach the door panels $110_1$ and $110_2$ onto the backplane 103 but allow for tightening of clearances within the hinges $106_1$ and $106_2$ as the door panels $110_1$ and $110_2$ pivotally rotate to a closed position substantially no gap is present between the door panels $110_1$ and $110_2$ and the backplane 103. Additional details relating to the cam-shaped hinges are disclosed in the '581 application.

In one embodiment, the backplane 103 and the door panels $110_1$ and $110_2$ further include heat sinks for dissipating heat generated by the electronic components 302 to the external environment. For example, the backplane 103 includes extruded heat transfer fins 140, convective openings, and other features of heat sinks as discussed in the '309 application and the '593 application. The door panels 110₁ and 110₂ include panel fins 304. In one embodiment, the backplane 103 and the door panels 110₁ and 110₂ comprise an extruded aluminum material, or the like, to transfer and conduct heat energy away from the interior of the enclosure 100 (when assembled) using the heat transfer fins 140 and the panel fins 304.

Figure 4C:
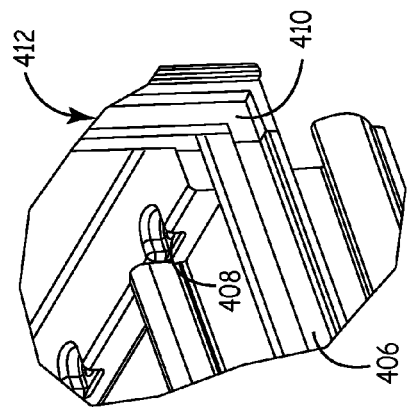
FIGS. 4A, 4B and 4C are perspective views of an embodiment of a combination extruded and cast metal outdoor electronics enclosure.
Figure 4A:
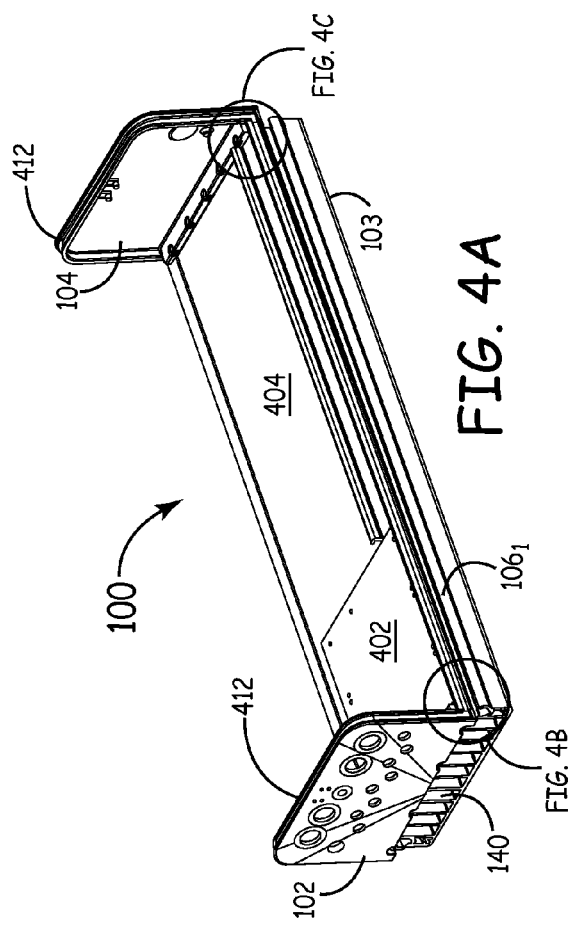
Figure 4B:
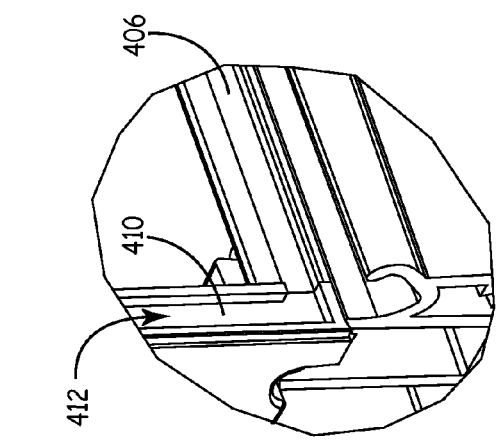

FIGS. 4A to 4C are perspective views of an embodiment of the extruded and cast metal outdoor electronics enclosure 100. The enclosure 100 further illustrates a length of the backplane 103 and the hinge 106₁ extending between the bottom endplate 102 and the top endplate 104, at an opposing end of the backplane 103. In one implementation, the backplane 103 and the hinge 106₁ are extruded to a single length, and this single length is cut to one or more lengths based on a particular configuration for the enclosure 100. For example, the enclosure 100 of FIG. 4A illustrates the bottom endplate 102 and the top endplate 104 affixed to the backplane 103 having a first length. In one embodiment, the bottom endplate 102 and the top endplate 104 are mechanically coupled to the backplane 103 using the screw fixtures discussed above with respect to FIG. 2. As shown in FIG. 4A, the backplane 103 comprises inner panel surfaces 402 and 404.

FIG. 4B provides a detailed view of an extruded slot, shown generally at 406, along the length of the backplane 103 where the extruded slot 406 mates with a gland (that is, a second slot) shown generally at 410, of the bottom endplate 102. As shown in FIG. 4B, an opening of the extruded slot 406 and an opening of the gland 410 form a continuous channel 412 along at least three sides of the bottom endplate 102 and the length of the backplane 103 for insertion of the perimeter seal 112. As discussed above with respect to FIG. 1A, the perimeter seal 112 is compressed when the door panels 110₁ and 110₂ are closed to provide a seal impermeable to liquids around the enclosure 100. This seal further provides water ingress protection at similar points in an assembled enclosure 100.

FIG. 4C provides a detailed view of a similar attachment point of the extruded slot 406 and the gland 410 between the top endplate 104 and the backplane 103 that forms the continuous channel 412. In the example embodiment of FIG. 4C, at least one load fastener slot 408 is provided for attachment of the top endplate 104 to the backplane 103 using the screw fixtures discussed above with respect to FIG. 2.

For the extrusion process of the backplane 103 shown in FIG. 4A, a preferred extrusion material (for example, aluminum) is involved in a particular finishing process. The particular finishing process for the backplane 103 involves a controlled oxidation process (for example, an electrolytic anodizing process) to increase the thickness of aluminum oxide onto the backplane 103. The controlled oxidation process performed on the backplane 103 provides a protection layer that prevents any additional oxidation (that is, corrosion) from occurring on the backplane 103.

The finishing process for the enclosure 100 discussed above is further enhanced for at least one of the inner surfaces 402 and 404. In order for electrical conduction to continue within the enclosure 100, a selective chromate application process is one process that may be performed on the inner surfaces 402 and 404. For example, an application of a relatively thin chromate layer on at least the inner surfaces 402 and 404 provides for proper grounding of the electronic components 302 housed in the enclosure 100. Parts may also be dipped in a batch without masking.

Figure 5:
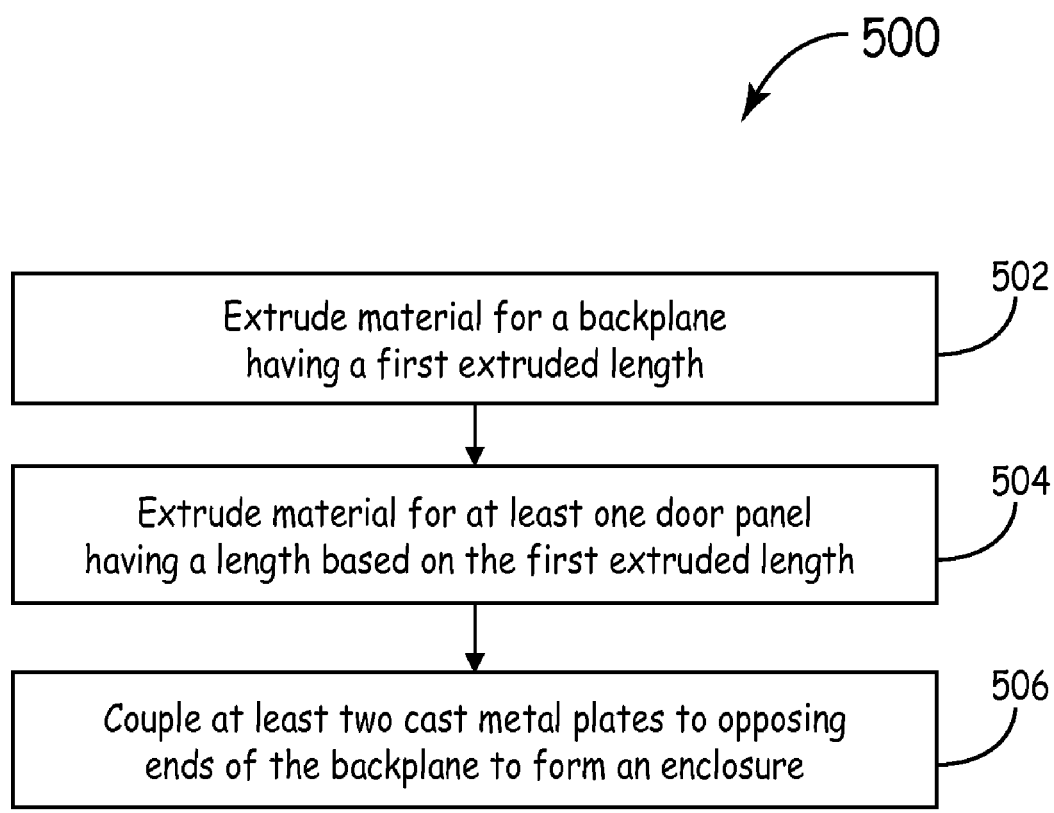
FIG. 5 is a flow diagram of an embodiment of a method for forming a combination extruded and cast metal outdoor electronics enclosure.

FIG. 5 is a flow diagram of an embodiment of a method for forming an electronics enclosure. The method of FIG. 5 addresses providing a plurality of similar outdoor electronics enclosures based on a prescribed length for a particular configuration for the electronics enclosure. In the example embodiment of FIG. 5, a backplane and at least one door panel for the enclosure are extruded at a first length to house a first set of telecommunication equipment. Similarly, the backplane and the door panel are extruded for a second enclosure at a second length to house a second set of telecommunications equipment depending on the configuration for the second set of telecommunications equipment. In at least one implementation, the method 500 includes an oxidation process for an outer surface of the backplane and applying a thickness of chromate on at least one inner surface of the backplane.

The method 500 begins by extruding material for the backplane having the first extruded length (block 502). In this embodiment, the backplane comprises slots on opposing sides of the backplane that extend along the first extruded length. The method 500 proceeds at block 504 with extruding material for the at least one door panel having a length based on the first extruded length. When two door panels are needed, either a second door panel is extruded by repeating the method at block 504, or alternatively, two or more door panels are cut from the length of material extruded at block 504. In one implementation, the backplane and the at least one door panel each have extruded hinge features for pivotally coupling the door panel to the backplane.

The method 500 proceeds with coupling at least two cast metal plates to opposing ends of the backplane to form an enclosure (block 506). The cast metal plates are fabricated in one of a machining or tooling process to include one or more features such as, but not limited to, cable access apertures, pilot holes for fasteners, and glands for inserting gaskets or seals. For example, in one embodiment, opposing ends of the backplane couple to the at least two cast plates by aligning slots of the backplane with the gland of each of the at least two cast metal plates to create a continuous channel for inserting a seal to provide an impermeable electronics enclosure.

This description has been presented for purposes of illustration, and is not intended to be exhaustive or limited to the embodiments disclosed. The embodiments disclosed are intended to cover any modifications, adaptations, or variations, which fall within the scope of the following claims.

What is claimed is:

1. A method for forming an electronics enclosure, the method comprising:
   extruding a backplane having a first extruded length, the backplane comprising first slots on opposing sides of the backplane, wherein the first slots extend along the first extruded length;
   extruding at least one door panel at the first extruded length, wherein the backplane and the door panel each have extruded hinge features for pivotally coupling the door panel to the backplane; and
   coupling at least two cast metal plates to opposing ends of the backplane, each of the cast metal plates comprising a second slot that aligns with the first slots of the backplane to create a continuous channel for inserting a seal.

2. The method of claim 1, wherein extruding the backplane comprises extruding heat transfer fins on at least one side of the backplane for removing heat.

3. The method of claim 1, wherein extruding the door panel comprises extruding one or more panel fins on an outer surface of the door panel for removing heat.

4. The method of claim 1, wherein extruding the door panel further comprises:
extruding at least a second door panel at the first extruded length.

5. The method of claim 1, further comprising:
fabricating the cast metal plates to include cable access apertures.

6. The method of claim 1, further comprising:
fabricating the cast metal plates to include pilot holes for fasteners.

7. The method of claim 1, further comprising:
performing an oxidation process for an outer surface of the backplane.

8. The method of claim 1, further comprising:
applying a thickness of chromate on at least one inner surface of the backplane.

9. An electronics enclosure, the enclosure comprising:
an extruded backplane having a first length, the backplane comprising first slots on opposing sides of the backplane and along the first length, the backplane further including an extruded hinge feature along the first length;
at least two cast metal plates coupled to opposing ends of the extruded backplane, each of the cast metal plates comprising a second slot that aligns with the first slots of the backplane to form a continuous channel for inserting a seal; and
at least one door panel of the first length, the door panel comprising an extruded hinge for pivotally coupling the door panel to the extruded hinge feature of the extruded backplane.

10. The enclosure of claim 9, wherein the extruded hinge of the door panel and the extruded hinge feature of the backplane are extruded as complementing cam-shaped profiles such that the cam-shaped profiles provide for a gap to attach the door panel onto the extruded backplane at a first position and, as the at least one door panel pivotally rotates to a second position, substantially no gap is present between the door panel and the extruded backplane.

11. The enclosure of claim 9, wherein the extruded backplane is comprised of an aluminum material.

12. The enclosure of claim 9, wherein the door panel is comprised of an extruded aluminum material.

13. The enclosure of claim 9, wherein the extruded backplane and the door panel comprise extruded fins for dissipating heat away from the enclosure and into an external environment.

14. An enclosure for electrical equipment, configured to enclose electronic components and dissipate heat to an external environment, the enclosure comprising:
an extruded backplane configured to secure one or more electronic components in place, the backplane having a first length, the backplane comprising first slots on opposing sides of the backplane, wherein the first slots extend along the first extruded length;
a first door panel of the first length coupled to a first side of the extruded backplane and configured to rotate between an open position and a closed position with extruded hinges;
a second door panel of the first length coupled to a second side of the extruded backplane and configured to rotate between an open position and a closed position with extruded hinges;
at least two cast metal plates coupled to opposing ends of the backplane, each of the cast metal plates having a second slot that aligns with the first slots of the extruded backplane to form a continuous channel for inserting a seal; and
wherein each of the first and second door panels comprise a first extruded section and a second extruded section which form an angle such that, when in the closed position, the first and second door panels interconnect with each other and together abut at least three sides of the at least two cast metal plates to enclose the one or more electronic components.

15. The enclosure of claim 14, wherein the first extruded section of each of the first and second door panels forms an approximately 90 degree angle with the second extruded section of each of the first and second door panels.

16. The enclosure of claim 14, wherein the extruded backplane comprises an extruded hinge feature.

17. The enclosure of claim 16, wherein the extruded hinge feature of the backplane and the extruded hinges of the first and the second door panels are extruded as complementing cam-shaped profiles such that the cam-shaped profiles provide for a gap to attach the first and the second door panels onto the extruded backplane at the open position and, as the first and the second door panels pivotally rotate to the closed position, substantially no gap is present between the first and the second door panels and the extruded backplane.

18. The enclosure of claim 14, wherein each of the first and second door panels further comprises one or more panel fins for dissipating heat to the external environment.

19. The enclosure of claim 14, wherein the extruded backplane is comprised of an aluminum material.

20. The enclosure of claim 14, wherein the first and the second door panels are comprised of an extruded aluminum material.

* * * * *